United States Patent
Lee et al.

(10) Patent No.: US 12,321,185 B2
(45) Date of Patent: Jun. 3, 2025

(54) LOW DROPOUT REGULATOR PROVIDING VARIABLE OFFSET AND ANALOG TO DIGITAL CONVERSION CIRCUIT INCLUDING THE SAME

(71) Applicant: Samsung Electronics Co., Ltd., Suwon-si (KR)

(72) Inventors: Jaehoon Lee, Suwon-si (KR); Yong Lim, Suwon-si (KR); Seunghyun Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 250 days.

(21) Appl. No.: 18/149,278

(22) Filed: Jan. 3, 2023

(65) Prior Publication Data

US 2023/0221747 A1 Jul. 13, 2023

(30) Foreign Application Priority Data

Jan. 7, 2022 (KR) .......... 10-2022-0002952
Sep. 2, 2022 (KR) .......... 10-2022-0111674

(51) Int. Cl.
*H03M 1/38* (2006.01)
*G05F 1/575* (2006.01)
*H03M 1/46* (2006.01)

(52) U.S. Cl.
CPC .............. *G05F 1/575* (2013.01); *H03M 1/46* (2013.01)

(58) Field of Classification Search
CPC ....... G05F 1/575; H03M 1/46; H03M 1/0863; H03M 1/12; H03M 1/38

USPC .......................................... 341/161
See application file for complete search history.

(56) References Cited

U.S. PATENT DOCUMENTS

| | | | |
|---|---|---|---|
| 7,948,304 B2 | 5/2011 | Aruga et al. | |
| 8,115,463 B2 | 2/2012 | Wang | |
| 9,444,414 B2 | 9/2016 | Peluso | |
| 9,537,398 B2 | 1/2017 | Arakawa et al. | |
| 10,104,752 B2* | 10/2018 | Goederer | H05G 1/58 |
| 10,185,344 B1* | 1/2019 | Kadanka | G05F 3/247 |
| 10,627,842 B2 | 4/2020 | Lu et al. | |
| 10,873,257 B2 | 12/2020 | Harjani et al. | |
| 10,930,322 B2 | 2/2021 | Koo et al. | |
| 10,936,001 B2 | 3/2021 | Du et al. | |
| 10,996,694 B2 | 5/2021 | Nam et al. | |
| 2011/0248688 A1 | 10/2011 | Iacob et al. | |
| 2017/0315574 A1* | 11/2017 | Brown | G05F 1/468 |

* cited by examiner

*Primary Examiner* — Jean B Jeanglaude
(74) *Attorney, Agent, or Firm* — Harness, Dickey & Pierce, P.L.C.

(57) ABSTRACT

A low dropout (LDO) regulator includes an operational amplifier connected to a capacitor receiving an input voltage through a first end and storing an offset voltage through a second end, a first transistor configured to control an electrical connection between the input voltage and the first end of the operational amplifier, a second transistor configured to control an electrical connection between the first end of the operational amplifier and a first node, a third transistor configured to control an electrical connection between an output end of the operational amplifier and a second node, and a fourth transistor configured to control an electrical connection between a second end of the operational amplifier and the output end of the operational amplifier.

20 Claims, 16 Drawing Sheets

LOW DROPOUT REGULATOR PROVIDING VARIABLE OFFSET AND ANALOG TO DIGITAL CONVERSION CIRCUIT INCLUDING THE SAME

CROSS-REFERENCE TO RELATED APPLICATIONS

This application is based on and claims priority under 35 U.S.C. § 119 to Korean Patent Application Nos. 10-2022-0002952, filed on Jan. 7, 2022 in the Korean Intellectual Property Office and 10-2022-0111674, filed on Sep. 2, 2022, in the Korean Intellectual Property Office, the disclosures of which are incorporated by reference herein in their entireties.

BACKGROUND

The inventive concepts relates to a low dropout (LDO) regulator and an analog-to-digital conversion (ADC) circuit, and more particularly, to an LDO regulator providing a variable offset and an ADC circuit including the same.

An ADC circuit may include at least one reference voltage generator to generate a reference voltage for converting a signal sampled from an analog input signal into a digital signal. An ADC may include, for example, a successive approximation register (SAR) ADC, and the reference voltage generator may supply the ADC with a peak current with high-frequency signal characteristics generated by a switching operation of a capacitive digital-to-analog converter (CDAC).

Generally, a reference voltage of the ADC is a reference for generating a correct digital signal by maintaining a constant value and comparing a comparative voltage generated from the reference voltage with a voltage of the sampled input signal. However, the reference voltage supplying the peak current with high-frequency signal characteristics may change due to the peak current, and the digital signal generated from the comparative voltage generated from the changed reference voltage may be distorted. In order to prevent or hinder such distortion, a reference voltage generator having a high output current is commonly used or a reference voltage capacitor having a high capacity, which requires or takes up a large area, is used.

SUMMARY

The inventive concepts relate to a low dropout (LDO) regulator, in which an alternating reference and a sub-ranging successive approximation register (SAR) analog-to-digital converter (ADC) are simultaneously or contemporaneously used by using a variable offset, and an analog-to-digital conversion (ADC) circuit including the same.

According to an example embodiment of the inventive concepts, there is provided an LDO regulator including an operational amplifier connected to a capacitor receiving an input voltage through a first end and storing an offset voltage through a second end, a first transistor configured to control an electrical connection between the input voltage and the first end of the operational amplifier, a second transistor configured to control an electrical connection between the first end of the operational amplifier and a first node, a third transistor configured to control an electrical connection between an output end of the operational amplifier and a second node, and a fourth transistor configured to control an electrical connection between a second end of the operational amplifier and the output end of the operational amplifier.

According to another example embodiment of the inventive concepts, there is provided an ADC circuit including a plurality of reference voltage generators configured to generate a reference voltage, an analog-to-digital converter (ADC) configured to generate a comparative voltage by bit based on the reference voltage, and to generate a digital signal corresponding to the analog signal based on a result of comparing the comparative voltage by bit with the analog signal, and a plurality of decoupling capacitors respectively connected to the plurality of reference voltage generators and partially connected to the ADC to correspond to a plurality of time periods of an entire time period. The reference voltage generator includes an operational amplifier connected to a capacitor receiving an input voltage through a first end and storing an offset voltage through a second end, an operational amplifier connected to a capacitor receiving an input voltage through a first end and storing an offset voltage through the second end, a first transistor configured to control an electrical connection between the input voltage and the first end of the operational amplifier, a second transistor configured to control an electrical connection between the first end of the operational amplifier and a first node, a third transistor configured to control an electrical connection between an output end of the operational amplifier and a second node, and a fourth transistor configured to control an electrical connection between a second end of the operational amplifier and the output end of the operational amplifier.

According to another example embodiment of the inventive concepts, there is provided an LDO regulator including an operational amplifier connected to a capacitor receiving an input voltage through a first end and storing an offset voltage through a second end and configured to control a differential input pair of the input voltage and to generate a second offset voltage having a variable value, a first transistor configured to control an electrical connection between the input voltage and the first end of the operational amplifier, a second transistor configured to control an electrical connection between the first end of the operational amplifier and a first node, a third transistor configured to control an electrical connection between an output end of the operational amplifier and a second node, and a fourth transistor configured to control an electrical connection between a second end of the operational amplifier and the output end of the operational amplifier.

BRIEF DESCRIPTION OF THE DRAWINGS

Example embodiments will be more clearly understood from the following detailed description taken in conjunction with the accompanying drawings in which.

DETAILED DESCRIPTION OF THE EXAMPLE EMBODIMENTS

Hereinafter, some example embodiments of the inventive concepts will be described in detail with reference to the accompanying drawings.

Figure 1:
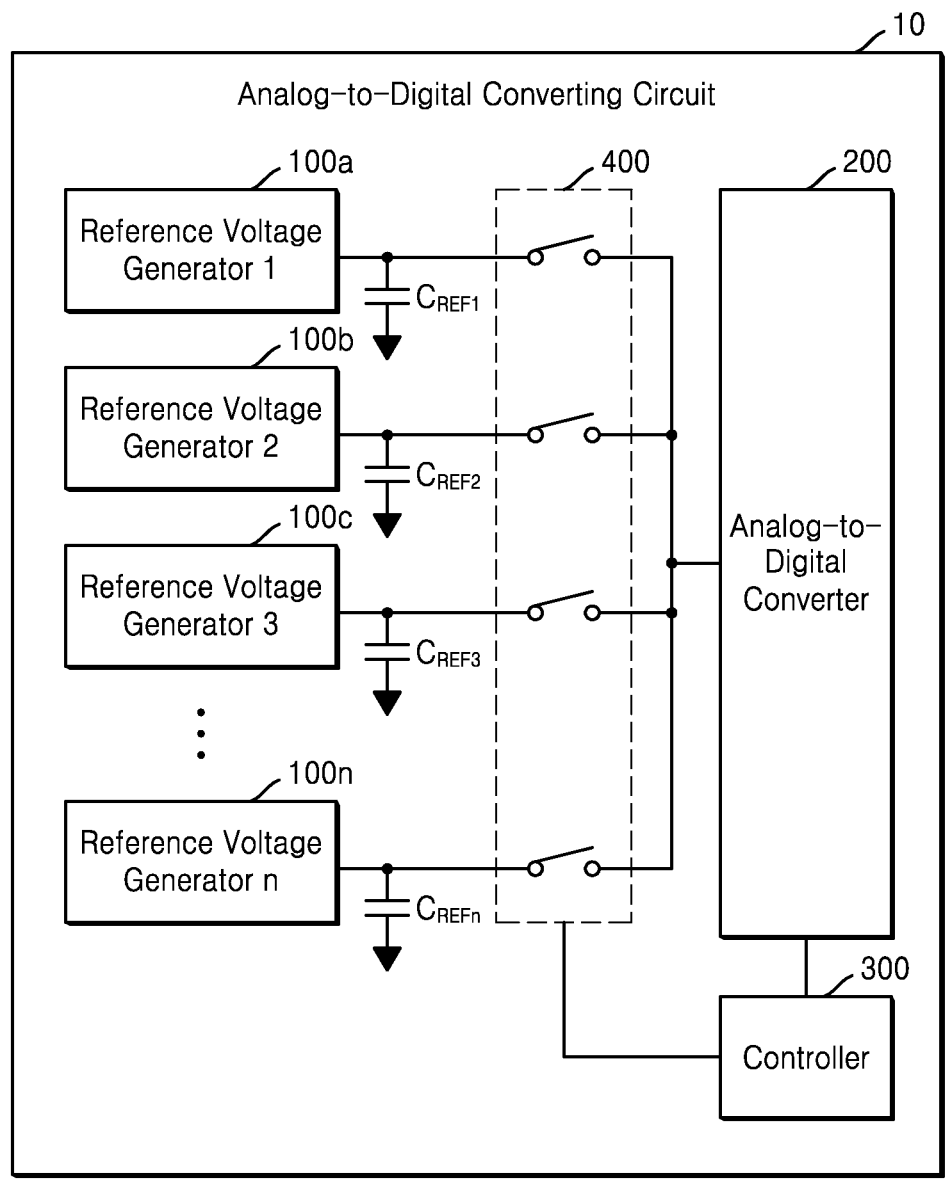
FIG. 1 is a block diagram schematically illustrating a plurality of components included in an analog-to-digital conversion (ADC) circuit according to some example embodiments of the inventive concepts.

FIG. 1 is a block diagram schematically illustrating a plurality of components included in an analog-to-digital conversion (ADC) circuit 10 according to some example embodiments of the inventive concepts.

Referring to FIG. 1, the ADC circuit 10 according to some example embodiments of the inventive concepts may be included in an electronic device to convert an analog signal into a digital signal. According to various example embodiments, the electronic device as a communication device may perform communication with another device. For example, the electronic device may be used for a wireless communication device, a cellular phone, a personal digital assistant (PDA), a handheld device, a wireless modem, a wireless phone, a wireless station, a Bluetooth device, a healthcare device, and a wearable device. In addition, the electronic device as a semiconductor device may program or read data at a request of a host.

A plurality of reference voltage generators 100a to 100n may receive input voltages and may generate reference voltages required by or desired for operation of an ADC 200 based on the input voltages. The reference voltages generated by the plurality of reference voltage generators 100a to 100n may have the same voltage value. However, the inventive concepts are not limited thereto. For example, the reference voltages generated by the plurality of reference voltage generators 100a to 100n may have different values between decoupling capacitors $C_{REF1}$ to $C_{REFn}$ included in the plurality of reference voltage generators 100a to 100n and capacitors included in the ADC 200 due to parasite capacitance, a gain error, and mismatch.

According to some example embodiments, at least one of a plurality of switches 400 may be connected to at least one of the plurality of reference voltage generators 100a to 100n so that at least one of the plurality of reference voltage generators 100a to 100n may be connected to the ADC 200. The ADC 200 may convert the analog signal into the digital signal based on the reference voltage provided by the reference voltage generator (at least one of the plurality of reference voltage generators 100a to 100n) connected to the ADC 200. For example, the ADC 200 may include a successive approximation register (SAR) ADC, and each of (or alternatively, at least one of) the plurality of reference voltage generators 100a to 100n may include a low dropout (LDO) regulator.

A controller 300 may control the plurality of switches 400 to provide the reference voltage from at least one of the plurality of reference voltage generators 100a to 100n to the ADC 200. In an example embodiment where the switches 400 are transistors with gates, the controller 300 may control the plurality of switches my providing a voltage to the gates to control the opening and closing of the switches 400. In addition, the controller 300 may transmit a control signal to the ADC 200 to generate a comparative voltage by bit in the digital signal including a plurality of bits. The comparative voltage may compare a voltage level thereof with a voltage level of the analog signal to determine a logic level of a corresponding bit, and the plurality of switches 400 may be controlled in the order of bits from the most significant bit (MSB) to the least significant bit (LSB).

Figure 2:
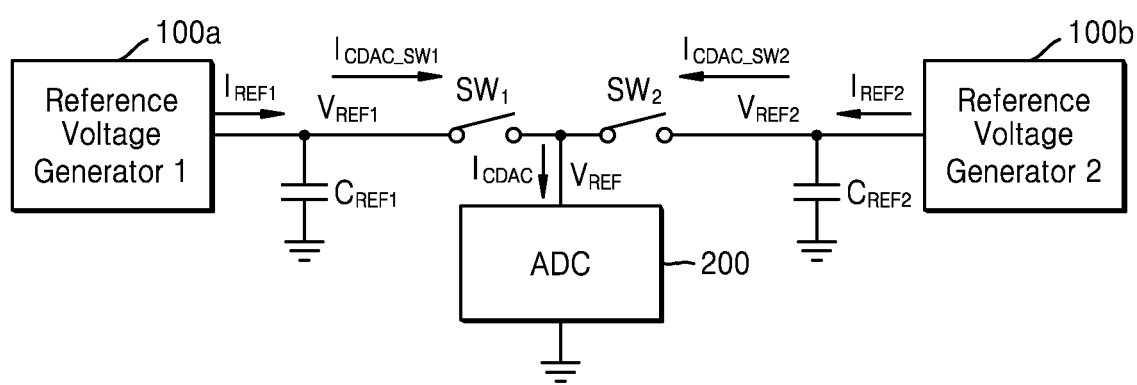
FIG. 2 is a block diagram illustrating a configuration of an ADC circuit according to some example embodiments of the inventive concepts, to which a plurality of reference voltage generators are connected.

FIG. 2 is a block diagram illustrating a configuration of the ADC circuit 10 according to some example embodiments of the inventive concepts, to which a plurality of reference voltage generators are connected.

Referring to FIG. 2, the ADC circuit 10 according to some example embodiments of the inventive concepts may include a first reference voltage generation circuit and a second reference voltage generation circuit, and the first reference voltage generation circuit may include a first reference voltage generator 100a and a first decoupling capacitor $C_{REF1}$ and the second reference voltage generation circuit may include a second reference voltage generator 100b and a second decoupling capacitor $C_{REF2}$.

The first reference voltage generation circuit or the second reference voltage generation circuit may supply the reference voltage to the ADC 200 in accordance with whether a first switch SW1 and a second switch SW2 respectively connected the first reference voltage generation circuit and the second reference voltage generation circuit are activated. According to some example embodiments, the first switch SW1 and the second switch SW2 may be alternately activated by a signal received at gates of the first and second switches SW1, SW2 (e.g., in an example embodiment where the first and second switches SW1, SW2 are transistors including gates) from controller 300 within the ADC or from other control circuitry. For example, when the first switch SW1 is activated in a first conversion period of an entire time period, the reference voltage generated by the first reference voltage generation circuit may be supplied to the ADC 200. At the same time, the second switch SW2 may be deactivated so that the reference voltage generated by the second reference voltage generation circuit may not be supplied to the ADC 200.

The first reference voltage generation circuit may include the first reference voltage generator 100a and the first decoupling capacitor $C_{REF1}$, and the second reference voltage generation circuit may include the second reference voltage generator 110b and the second decoupling capacitor $C_{REF2}$. Each of (or alternatively, at least one of) the first reference voltage generator 100a and the second reference voltage generator 100b may include an LDO regulator. Circuit diagrams of the first and second reference voltage generators 100a and 100b will be described in detail with reference to FIG. 4A.

The ADC 200 may convert the received analog signal into the digital signal and may sample the analog signal before converting the analog signal into the digital signal. The ADC 200 according to some example embodiments may include the SAR ADC and may generate the digital signal for a sampled signal based on a result of comparing the comparative voltage generated by the reference voltage with the sampled signal. At this time, the SAR ADC may change the comparative voltage for each bit to be converted into a digital signal and may compare the sampled signal with the comparative voltage.

The first switch SW1 and the second switch SW2 respectively connected the first reference voltage generation circuit and the second reference voltage generation circuit may be controlled by the controller 300 of FIG. 1. For example, while the first switch SW1 is activated and the second switch SW2 is deactivated in the first conversion period, the first switch SW1 may be deactivated and the second switch SW2 may be activated in a second conversion period.

Figure 3:
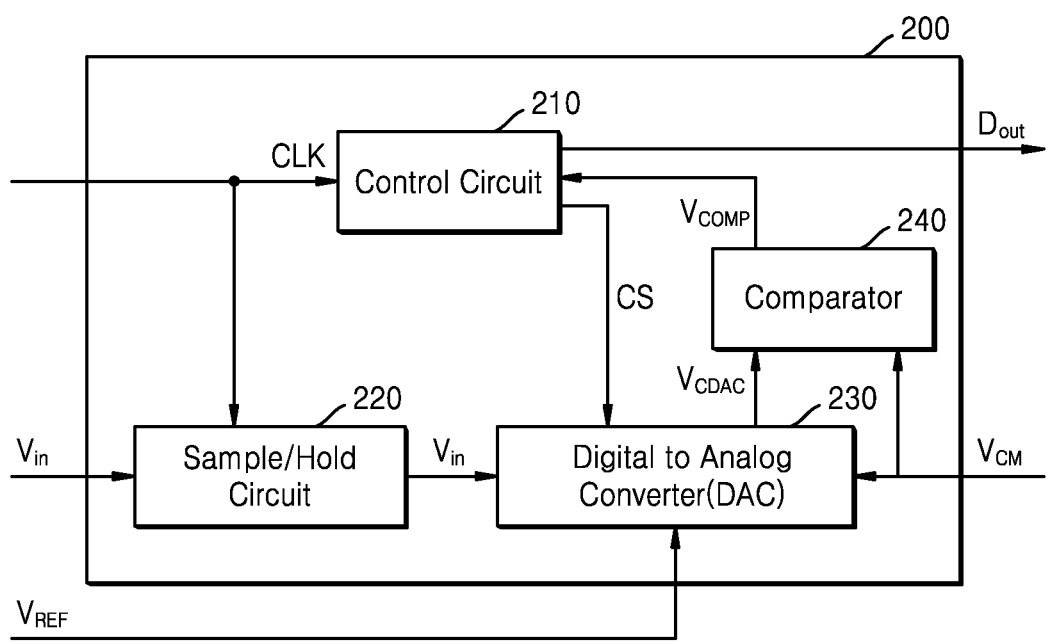
FIG. 3 is a block diagram illustrating a configuration of an analog-to-digital converter (ADC) according to some example embodiments of the inventive concepts.

FIG. 3 is a block diagram illustrating a configuration of the ADC 200 according to some example embodiments of the inventive concepts.

Referring to FIG. 3, the ADC 200 may include a control circuit 210, a sample/hold circuit 220, a digital-to-analog converter (DAC) 230, and a comparator 240.

The ADC 200 may receive a clock signal CLK from the outside and may convert the analog signal in synchronization with the clock signal CLK.

The sample/hold circuit 220 may receive the clock signal CLK and an input signal $V_{in}$ that is the analog signal to perform a sampling operation. The sample/hold circuit 220 may generate a sampled signal from the input signal $V_{in}$ based on the clock signal CLK and may output the sampled signal to the DAC 230. The control circuit 210 may supply a control signal CS to the DAC 230, and the DAC 230 may generate a comparative voltage $V_{CDAC}$ in response to the control signal CS.

The DAC 230 may generate the comparative voltage $V_{CDAC}$ for each bit to be generated in the digital signal including a plurality of bits based on a reference voltage $V_{REF}$ received from a reference voltage generator 100 and a common voltage $V_{CM}$.

The comparative voltage $V_{CDAC}$ may have a voltage level obtained by adding or subtracting a voltage level of the reference voltage $V_{REF}$ or a voltage level of the common voltage $V_{CM}$ to or from a voltage level of the sampled signal received from the sample/hold circuit 220.

The comparator 240 may generate a comparison result voltage $V_{COMP}$ by comparing the comparative voltage $V_{CDAC}$ generated by the DAC 230 with the common voltage $V_{CM}$. For example, the DAC 230 may generate the comparative voltage $V_{CDAC}$ for determining a logic level of the MSB, and the comparator 240 may compare the common voltage $V_{CM}$ with the comparative voltage $V_{CDAC}$. The comparator 240 may output the comparison result voltage $V_{COMP}$ at a logic high level when it is determined that the comparative voltage $V_{CDAC}$ is equal to or greater than the common voltage $V_{CM}$, and may output the comparison result voltage $V_{COMP}$ at a logic low level when it is determined that the comparative voltage $V_{CDAC}$ is less than the common voltage $V_{CM}$.

The comparator 240 may provide data at a logic level determined for each bit to the control circuit 210, and the control circuit 210 may generate the control signal CS for generating the comparative voltage $V_{CDAC}$ of a next bit in accordance with the received logic level. For example, the control circuit 210 may determine a voltage lower than the comparative voltage corresponding to the MSB as the comparative voltage corresponding to the next bit when data at a logic high level is output to correspond to the MSB, and may determine a voltage higher than the comparative voltage corresponding to the MSB as the comparative voltage corresponding to the next bit when data at a logic low level is output to correspond to the MSB. That is, the voltage level of the comparative voltage $V_{CDAC}$ corresponding to a lower bit may vary in accordance with a logic level of an upper bit.

The comparator 240 may provide the comparison result voltage $V_{COMP}$ corresponding to each bit from the MSB to the LSB to the control circuit 210, and the control circuit 210 may generate a digital output signal $D_{OUT}$ based on a logic level of the comparison result voltage $V_{COMP}$ corresponding to each bit. The digital output signal $D_{OUT}$ generated by the control circuit 210 may include, for example, data information including a series of bits.

Figure 4A:
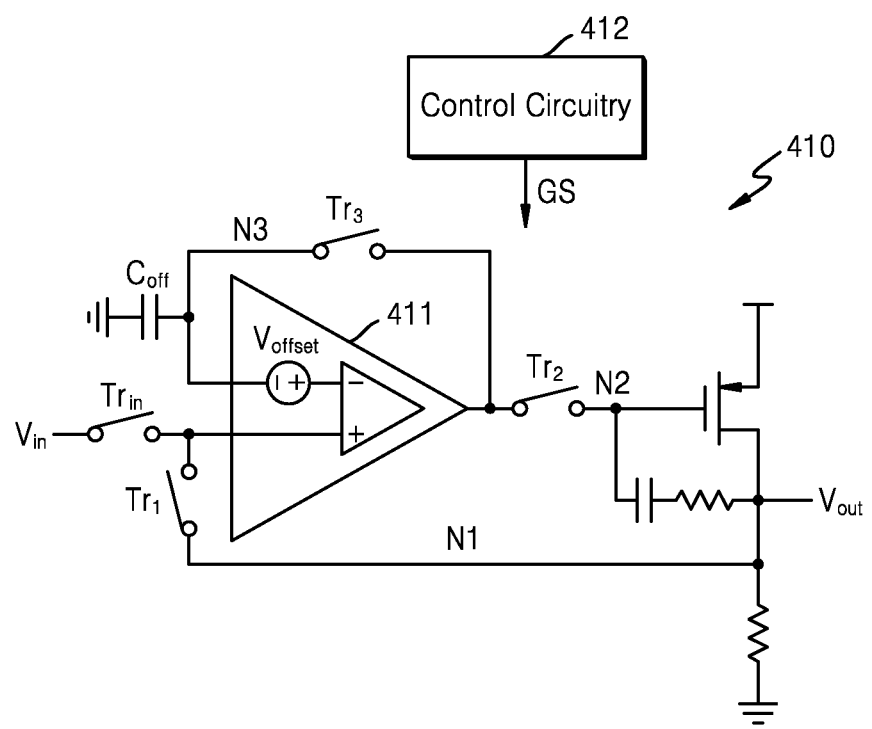
FIG. 4A is a circuit diagram of a low dropout (LDO) regulator according to some example embodiments.
Figure 4B:
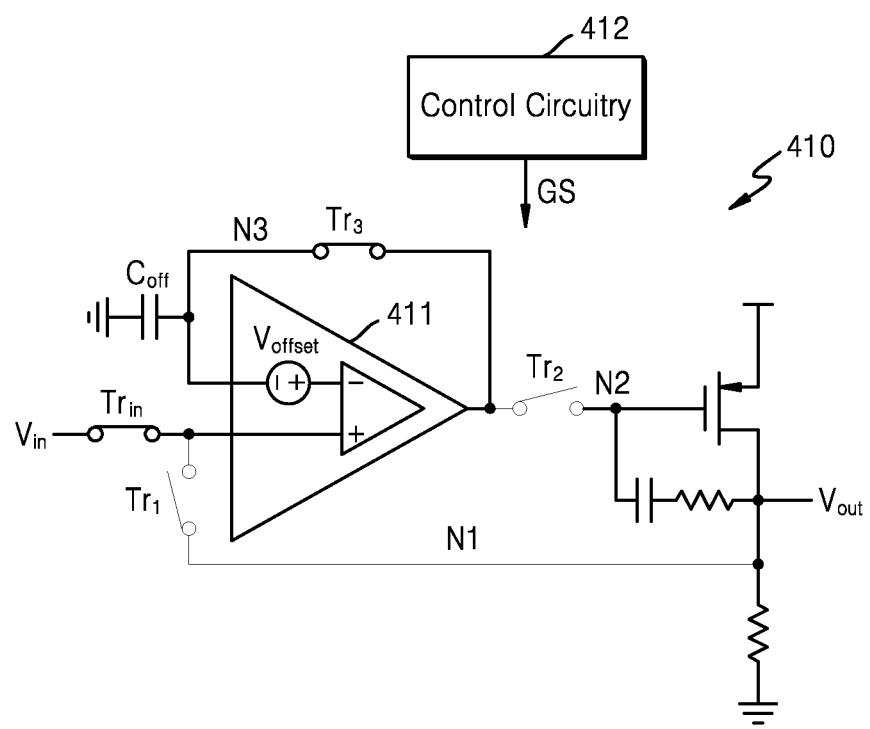
FIG. 4B is a circuit diagram of an LDO regulator corresponding to a first operation mode according to some example embodiments.
Figure 4C:
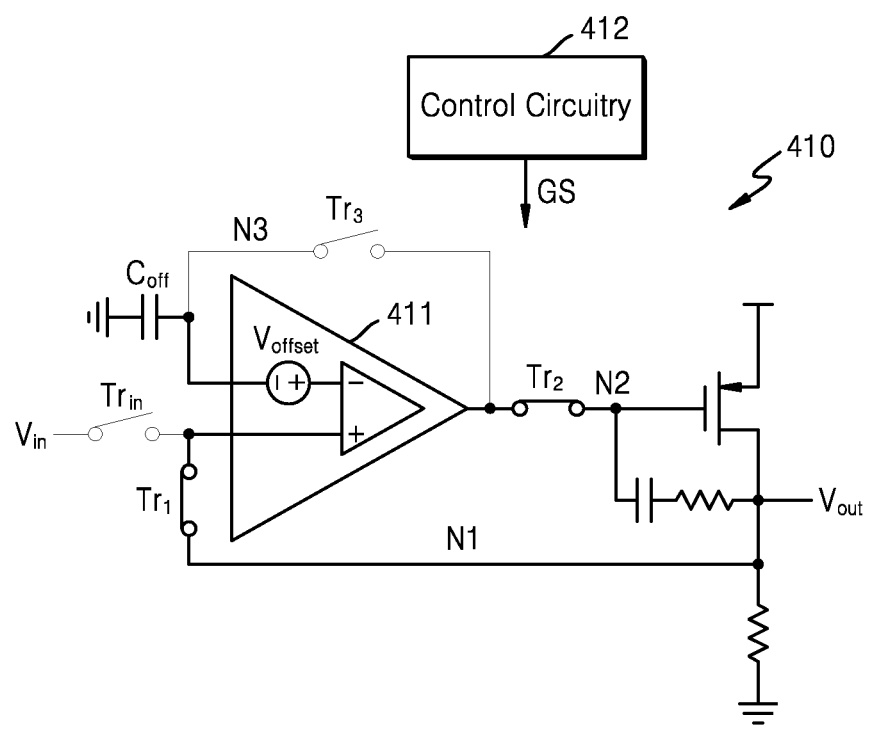
FIG. 4C is a circuit diagram of an LDO regulator corresponding to a second operation mode according to some example embodiments.

FIG. 4A is a circuit diagram of an low dropout (LDO) regulator 410 according to some example embodiments, FIG. 4B is a circuit diagram of an LDO regulator corresponding to a first operation mode according to some example embodiments, and FIG. 4C is a circuit diagram of an LDO regulator corresponding to a second operation mode according to some example embodiments.

Referring to FIG. 4A, the LDO regulator 410 may include an operational amplifier 411, a first transistor $Tr_1$, a second transistor $Tr_2$, a third transistor $Tr_3$, a first capacitor $C_{off}$, and an output resistor $R_{out}$.

A first terminal of the operational amplifier 411 may receive the input voltage $V_{in}$. The first terminal of the operational amplifier 411 may include a non-inverting input terminal (+) thereof. The input voltage $V_{in}$ may be input to the first terminal of the operational amplifier 411 in response to the turning on of an input transistor $Tr_{in}$.

The first terminal of the operational amplifier 411 may be electrically connected to a first node N1. The first node N1 may correspond to a voltage node of an output voltage. For example, in response to the turning on of the first transistor $Tr_1$, the first terminal of the operational amplifier 411 may be electrically connected to the first node N1. According to some example embodiments, the input transistor $Tr_{in}$ and the first transistor $Tr_1$ may be alternately turned on. For example, when the input transistor $Tr_{in}$ is turned on, the first transistor $Tr_1$ may be turned off.

A second terminal of the operational amplifier 411 may be electrically connected to a third node N3. The second terminal of the operational amplifier 411 may include an inverting input terminal (−) thereof. A voltage level of the third node N3 may be lower than a voltage level of the inverting input terminal (−) by a voltage level of an offset voltage $V_{offset}$. The offset voltage $V_{offset}$ may include a value randomly generated based on process-voltage-temperature (PVT) variation of a process and a mismatch of a metal. When the operational amplifier 411 is ideal, the voltage level of the inverting input terminal (−) may remain the same as a voltage level of the non-inverting input terminal (+). However, in order to reflect a case in which the operational amplifier 411 is non-ideal, the offset voltage $V_{offset}$ may be modeled. Therefore, when the operational amplifier 411 is receiving the input voltage $V_{in}$, the voltage level of the non-inverting input terminal (+) is the same as that of the input voltage $V_{in}$, and thus, the voltage level of the inverting input terminal (−) is the same as that of the input voltage $V_{in}$, so that the voltage level of the third node N3 may be obtained by reducing the voltage level of the input voltage $V_{in}$ by that of the offset voltage $V_{offset}$.

The first capacitor $C_{off}$ may store electric charges until a voltage level thereof is the same as that of the third node N3. According to various example embodiments, a capacitance value of the first capacitor $C_{off}$ may be determined based on a gate leakage current, charge injection into the first to third transistors $Tr_1$, $Tr_2$, and $Tr_3$, and the input transistor $Tr_{in}$, feedthrough of a clock signal, and refresh timing. For example, the capacitance value of the first capacitor $C_{off}$ may be designed to be less than 100 fF. The third transistor $Tr_3$ may be turned on or off in accordance with an operation mode of the LDO regulator 410. According to some example embodiments, the third transistor $Tr_3$ may be turned on or off together with the input transistor $Tr_{in}$. In addition, the third transistor $Tr_3$ may be alternately turned on or off with the first transistor $Tr_1$ and the second transistor $Tr_2$. That is, when the third transistor $Tr_3$ and the input transistor $Tr_{in}$ are turned off, the first transistor $Tr_1$ and the second transistor $Tr_2$ may be turned on. When the third transistor $Tr_3$ and the input transistor $Tr_{in}$ are turned on, the first transistor $Tr_1$ and the second transistor $Tr_2$ may be turned off. When the third transistor $Tr_3$ is turned on, a closed loop including an output node of the operational amplifier 411, the first capacitor $C_{off}$, and an inverted input terminal of the operational amplifier 411 may be generated. The LDO regulator 410 may include control circuitry 412 which is configured to control the first to fourth transistors $Tr_{1-4}$. The control circuitry 412 may output a gate control signal (GS) which is output to gates of the first to fourth transistors $Tr_{1-4}$. Connections between the control circuitry 312 and the first to fourth transistors $Tr_{1-4}$ is not shown for clarity. In some embodiments the control circuitry 412 may be included within other hardware in the analog-to-digital converting circuit 10 such as the controller 300 and control circuit 210. As another example, the gate control signal GS may be included in the control signal GS output from the control circuit 210 when the control circuitry 412 is included in the control circuit 210. The control circuitry 412 may be configured to control the first to fourth transistors $Tr_{1-4}$ in the various modes of operation of the LDO regulator 410.

Referring to FIG. 4B, the LDO regulator 410 may operate in the first operation mode. In the first operation mode, an operation for sampling the offset voltage $V_{offset}$ may be performed. For example, in response to the first operation mode, the input transistor $Tr_{in}$ of the LDO regulator 410 may be turned on and the first transistor $Tr_1$ thereof may be turned off. Accordingly, a non-inverting input node of the operational amplifier 411 may be electrically connected to the input voltage $V_{in}$. While the LDO regulator 410 operates in the first operation mode, the second transistor $Tr_2$ of the LDO regulator 410 may be turned off and the third transistor $Tr_3$ thereof may be turned on. Because an inverting input node of the operational amplifier 411 is short-circuited with the non-inverting input node thereof, the voltage level of the third node N3 may be obtained by subtracting the voltage level of the offset voltage V offset from the voltage level of the input voltage $V_{in}$. The first capacitor $C_{off}$ may be charged until the voltage level thereof reaches the voltage level of the third node N3.

Referring to FIG. 4C, the LDO regulator 410 may operate in the second operation mode. For example, in response to entry into the second operation mode, the input transistor $Tr_{in}$ of the LDO regulator 410 may be turned off and the first transistor $Tr_1$ thereof may be turned on. Accordingly, the non-inverting input node of the operational amplifier 411 may be electrically connected to the first node N1. While the LDO regulator 410 operates in the second operation mode, the second transistor $Tr_2$ of the LDO regulator 410 may be turned on and the third transistor $Tr_3$ thereof may be turned off. Because the non-inverting input node of the operational amplifier 411 is short-circuited with the inverting input node thereof, the voltage level of the first node N1 may be the same as that of the non-inverting input node. At this time, because a voltage level at which the first capacitor $C_{off}$ is buffered is obtained by reducing the voltage level of the input voltage $V_{in}$ by the voltage level of the offset voltage $V_{offset}$, the voltage level of the inverting input node may be obtained by increasing the voltage level at which the first capacitor $C_{off}$ is buffered by the voltage level of the offset voltage $V_{offset}$ again. That is, the voltage level of the inverting input node may be the same as that of the input voltage Vie.

In other words, the LDO regulator 410 may operate regardless of the offset voltage $V_{offset}$ without using an active element requiring additional power supply, by adding a capacitor and switching transistors, storing the voltage level of the offset voltage $V_{offset}$ in the first capacitor $C_{off}$ in the first operation mode, and offsetting (or canceling) the stored voltage level of the offset voltage $V_{offset}$ in the second operation mode.

Figure 5:
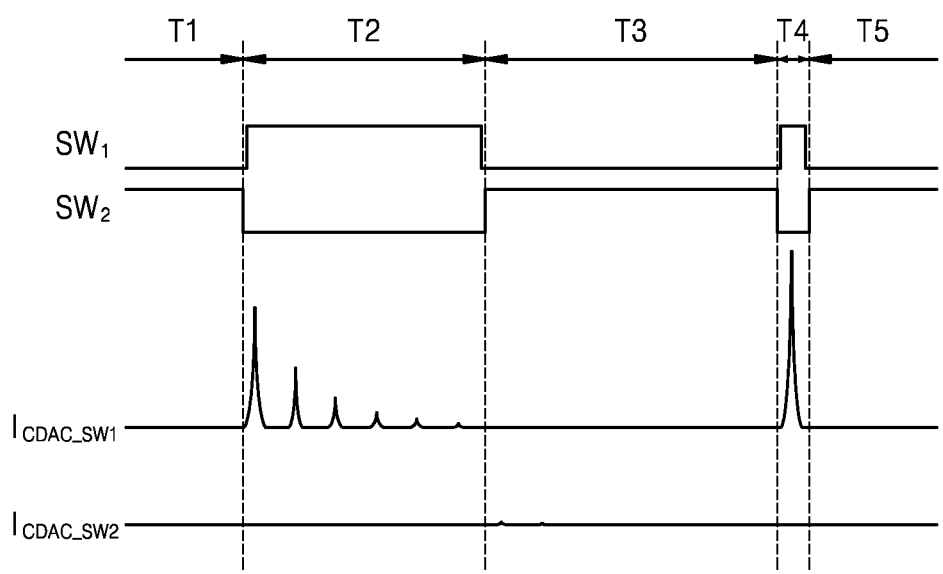
FIG. 5 is a graph illustrating switching signals applied to first and second switches according to some example embodiments of the inventive concepts and a comparative current supplied to an ADC.

FIG. 5 is a graph illustrating switching signals applied to a plurality of switches according to some example embodiments of the inventive concepts and a comparative current supplied to the ADC 200.

Referring to FIGS. 2 and 5, the first switch SW1 connecting the first reference voltage generation circuit to the ADC 200 may be activated in a conversion period different from that in which the second switch SW2 connecting the second reference voltage generation circuit to the ADC 200 is activated. For example, in the entire conversion period, the first switch SW1 may be activated and the second switch SW2 may be deactivated in the first conversion period, and the first switch SW1 may be deactivated and the second switch SW2 may be activated in the second conversion period.

The first conversion period in which the first switch SW1 is activated may be a time period in which a large voltage shift is required or desired in the comparative voltage whenever a capacitive digital-to-analog converter (CDAC) switching operation is performed, and the second conversion period in which the second switch SW2 is activated may be a time period in which a small voltage shift is required or desired in the comparative voltage whenever a CDAC switching operation is performed.

The first conversion period may be a time period in which a large peak current is provided from the first decoupling capacitor $C_{REF1}$ of the first reference voltage generation circuit to the ADC 200 so that a fluctuation range of the reference voltage $V_{REF}$ is large. Meanwhile, the second conversion period may be a time period in which a small peak current is provided from the second decoupling capacitor $C_{REF2}$ of the second reference voltage generation circuit to the ADC 200 so that the fluctuation range of the reference voltage $V_{REF}$ is small. For example, a second time period T2 of FIG. 5 may be the first conversion period, and a third time period T3 thereof may be the second conversion period.

In addition, in the ADC circuit 10, because the large peak current is to be output from a reference voltage generation circuit in a fourth time period T4 in which the DAC 230 is reset, the first switch SW1 may be activated to connect the first reference voltage generation circuit to the ADC 200. On the other hand, because the large peak current does not need to be output in the first time period T1 and a fifth time period T5 for performing the sampling operation, the second switch SW2 may be activated.

Figure 6:
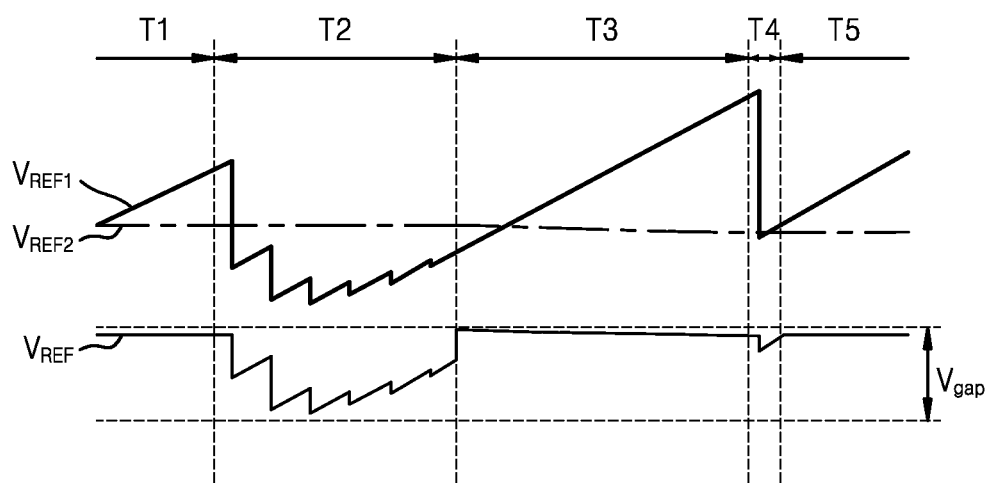
FIG. 6 is a graph illustrating first and second reference voltages generated by an ADC circuit according to some example embodiments of the inventive concepts and first and second reference voltages applied to an ADC.

FIG. 6 is a graph illustrating first and second reference voltages $V_{REF1}$ and $V_{REF2}$ generated by the ADC circuit 10 according to some example embodiments of the inventive concepts and the first and second reference voltages $V_{REF1}$ and $V_{REF2}$ applied to the ADC 200.

Referring to FIGS. 5 and 6, the first reference voltage $V_{REF1}$ generated by the first reference voltage generation circuit may be applied to the ADC 200 in the second time period T2 and the second reference voltage $V_{REF2}$ generated by the second reference voltage generation circuit may be applied to the ADC 200 in the third time period T3.

The reference voltage $V_{REF}$ may be a direct current (DC) voltage. However, the fluctuation range of the reference voltage $V_{REF}$ illustrated in FIG. 6 may expand in a voltage scale direction for convenience sake. When the fluctuation range of the reference voltage $V_{REF}$ increases due to the peak current, because an incorrect comparative voltage may be generated, an error may occur in an analog-to-digital conversion result. In order to correct the error, the ADC circuit 10 may perform an error correction operation using redundancy.

For example, according to FIG. 6, the reference voltage $V_{REF}$ generated in the second time period T2 has a lower voltage level than that of the reference voltage $V_{REF}$ generated in the third time period T3, and the ADC circuit 10 may generate the incorrect comparative voltage in accordance with a difference between the minimum value of the reference voltage $V_{REF}$ generated in the second time period T2 and the maximum value of the reference voltage $V_{REF}$ generated in the third time period T3.

The error correction operation using redundancy may mean additionally performing a conversion operation on one dummy bit. For example, an error occurring in the first conversion period may be corrected by performing a conversion operation on one dummy bit between the first conversion period and the second conversion period. The error correction operation using redundancy according to some example embodiments of the inventive concepts may be performed not only between the first conversion period and the second conversion period, but also in all periods performing a second conversion operation.

Figure 7:
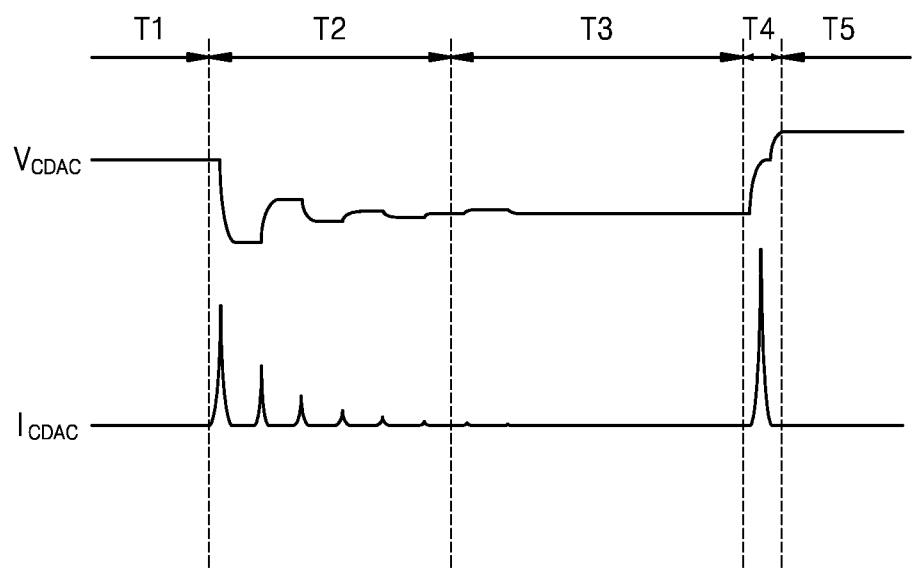
FIG. 7 is a graph illustrating a comparative voltage and a comparative current generated by an ADC according to FIGS. 5 and 6.

FIG. 7 is a graph illustrating the comparative voltage $V_{CDAC}$ and a comparative current $I_{CDAC}$ generated by the ADC 200 according to FIGS. 5 and 6.

Referring to FIG. 7, the peak current required by or desired for operation of the DAC 230 may be supplied from the first reference voltage generation circuit to the ADC 200 in the second time period T2, and the peak current required by or desired for operation of the DAC 230 may be supplied from the second reference voltage generation circuit to the ADC 200 in the third time period T3. Referring to FIGS. 5 and 7, a first peak current of FIG. 5 may be the peak current in the second time period T2 of FIG. 7, and a second peak current of FIG. 5 may be the peak current in the third time period T3 of FIG. 7.

Whenever CDAC switching operations are performed in the second time period T2 and in the third time period T3, the comparative voltage $V_{CDAC}$ may be reduced or increased by the peak current consumed by the CDAC, and the peak current corresponding to the comparative voltage $V_{CDAC}$ may be applied to the ADC 200. After the conversion operation is completed, a CDAC reset operation may be performed by receiving the peak current by the first reference voltage generation circuit in the fourth time period T4.

The ADC circuit 10 according to some example embodiments of the inventive concepts may generate the reference voltage $V_{REF}$ by using capacitors with smaller capacities than in a comparative example embodiment by generating the reference voltage $V_{REF}$ by different reference voltage generation circuits in the first conversion period with a large fluctuation range of the comparative voltage $V_{CDAC}$ and a large peak current, and a second conversion period with a small fluctuation range of the comparative voltage $V_{CDAC}$ and a small peak current. In addition, because the small peak current is required or desired in the second conversion period, the LDO of the second reference voltage generation circuit may generate the reference voltage $V_{REF}$ with less power than in the comparative example embodiment.

It is described above that the first reference voltage generation circuit and the second reference voltage generation circuit alternately provide the reference voltage $V_{REF}$ to the ADC 200. However, the ADC circuit 10 according to some example embodiments of the inventive concepts is not limited thereto, and three or more reference voltage generation circuits may provide the reference voltage $V_{REF}$ to the ADC 200.

Figure 8A:
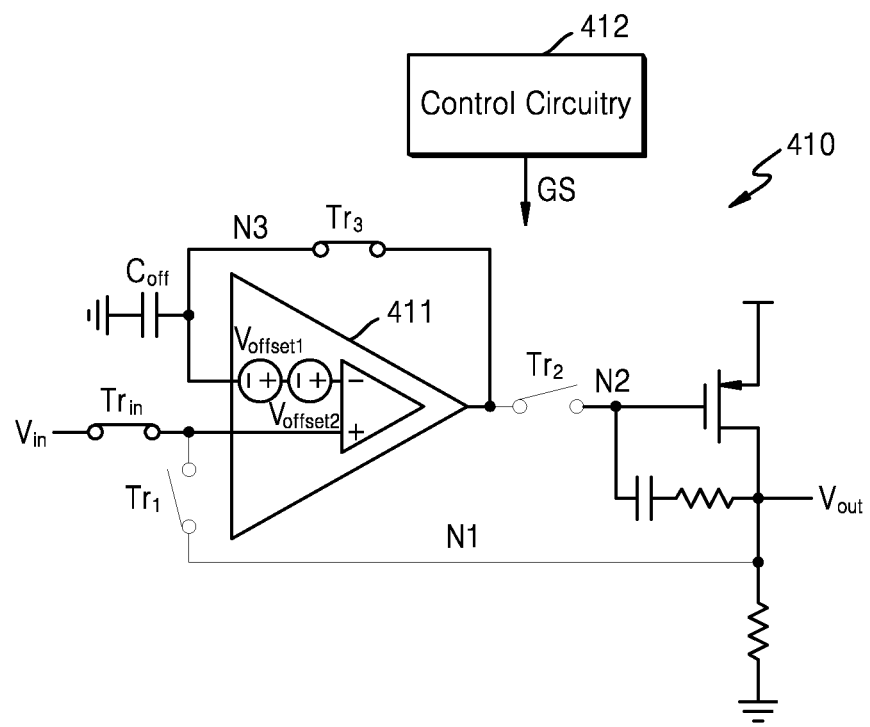
FIG. 8A is a circuit diagram corresponding to a first operation mode of an LDO regulator into which a second offset voltage is injected according to some example embodiments.
Figure 8B:
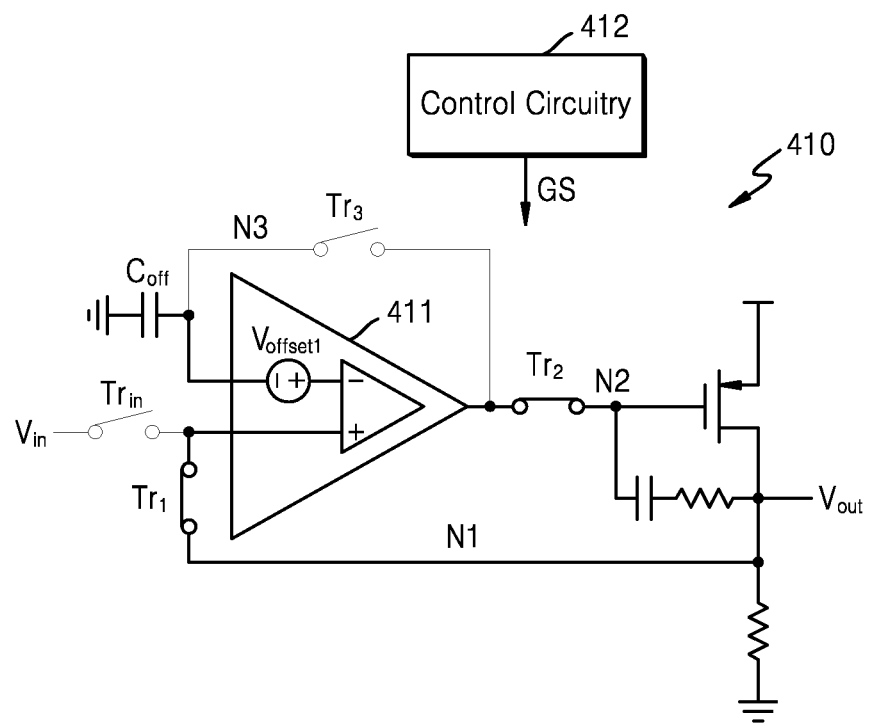
FIG. 8B is a circuit diagram corresponding to a second operation mode of an LDO regulator into which a second offset voltage is injected according to some example embodiments.

FIG. 8A is a circuit diagram corresponding to a first operation mode of an LDO regulator 410 into which a second offset voltage $V_{offset2}$ is injected according to some example embodiments, and FIG. 8B is a circuit diagram corresponding to a second operation mode of an LDO regulator 410 into which a second offset voltage $V_{offset2}$ is injected according to some example embodiments.

Referring to FIG. 8A, the LDO regulator 410 may further include a voltage source corresponding to the second offset voltage $V_{offset2}$ connected to the inverting input terminal of the operational amplifier 411. Referring to FIGS. 4A and 8A together, the offset voltage $V_{offset}$ of FIG. 4A may correspond to a first offset voltage $V_{offset1}$ of FIG. 8A. At this time, the first offset voltage $V_{offset1}$ and the second offset voltage $V_{offset2}$ are not actual voltage sources, and are obtained by modeling forcibly injected extrinsic offset voltages as voltage sources by controlling an intrinsic offset voltage of the operational amplifier 411 and a differential input pair of the input voltage $V_{in}$.

The operational amplifier 411 in the first operation mode may receive the input voltage $V_{in}$ through the first terminal. The first terminal of the operational amplifier 411 may include a non-inverting input terminal (+) thereof. The input voltage $V_{in}$ may be input to the first terminal of the operational amplifier 411 in response to the turning on of an input transistor $Tr_{in}$.

A second terminal of the operational amplifier 411 may be electrically connected to a third node N3. The second terminal of the operational amplifier 411 may include an inverting input terminal (−) thereof. The voltage level of the third node N3 may be determined based on the following equation.

$$V_{Coff} = V_{N3} = V_{in} - (V_{offset1} V_{offset2}) \qquad \text{[EQUATION 1]}$$

The voltage level of the third node N3 may be the same as the voltage level at which the first capacitor $C_{off}$ is buffered, and the voltage level of the third node N3 may be reduced from the voltage level of the inverting input terminal by a voltage level of the sum of the first offset voltage $V_{offset1}$ and the second offset voltage $V_{offset2}$.

Referring to FIG. 8B, the LDO regulator 410 may operate in the second operation mode. For example, in response to the entry into the second operation mode, the input transistor $Tr_{in}$ of the LDO regulator 410 may be turned off and the first transistor $Tr_1$ thereof may be turned on. In addition, in response to the entry into the second operation mode, a difference in the differential input pair of the input voltage $V_{in}$ may be removed. Accordingly, the voltage source generating the second offset voltage $V_{offset2}$ may be modeled as being deactivated. On the other hand, because the first offset voltage $V_{offset1}$ is an intrinsic characteristic value of the operational amplifier 411, the first offset voltage $V_{offset1}$ may be maintained even in the entry into the second operation mode. Accordingly, the non-inverting input terminal of the operational amplifier 411 may be electrically connected to the first node N1. While the LDO regulator 410 operates in the second operation mode, the second transistor $Tr_2$ of the LDO regulator 410 may be turned on and the third transistor $Tr_3$ thereof may be turned off. Because the non-inverting input node of the operational amplifier 411 is short-circuited with the inverting input node, the voltage level of the first node N1 may be the same as the voltage level of the non-inverting input node, and the voltage level of the non-inverting input node and an output voltage $V_{out}$ may be determined in accordance with the following equation.

$$V_{out}=V_{N1}=V_{in}-(V_{offset1}+V_{offset2})+V_{offset1}=V_{in}-V_{offset2} \quad \text{[EQUATION 2]}$$

In the second operation mode, the output voltage $V_{out}$ may be the same as the voltage level of the first node N1, and the voltage level of the first node N1 may be the same as the voltage level of the non-inverting input node of the operational amplifier 411. On the other hand, the voltage level of the non-inverting input node may be obtained by increasing the voltage level at which the first capacitor $C_{off}$ is buffered by a voltage level of the first offset voltage $V_{offset1}$.

That is, the operational amplifier 411 according to some example embodiments may control a magnitude of the output voltage $V_{out}$ by controlling the differential input pair of the input voltage $V_{in}$ in the first operation mode to forcibly apply a difference in the second offset voltage $V_{offset2}$ and removing the difference in the differential input pair in the second operation mode. The LDO regulator 410 may control the first capacitor $C_{off}$ to be charged in accordance with a voltage level of a voltage further reduced by the second offset voltage $V_{offset2}$ in addition to the first offset voltage $V_{offset1}$ in the first operation mode, and may remove the second offset voltage $V_{offset2}$ by removing the difference forcibly applied to the differential input pair in the second operation mode to reduce the voltage from the input voltage $V_{in}$ by the second offset voltage $V_{offset2}$. In addition, while reducing the output voltage $V_{out}$ by the second offset voltage $V_{offset2}$ having various values, a mismatch of the first offset voltage $V_{offset1}$ that may have various values in accordance with manufacturing process of the LDO regulator 410 may also be removed.

Figure 9A:
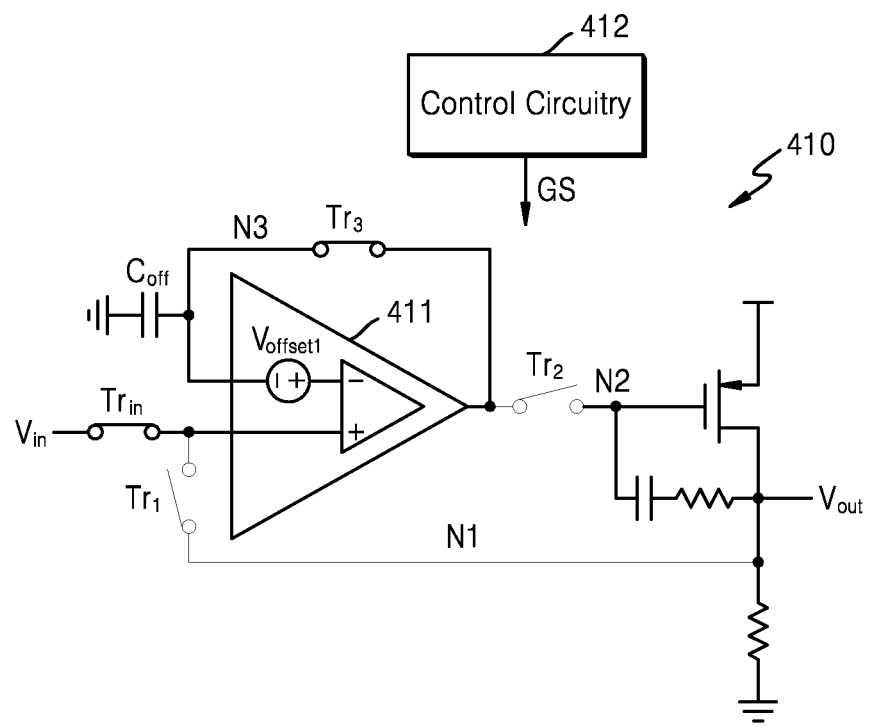
FIG. 9A is a circuit diagram corresponding to a first operation mode of an LDO regulator into which a second offset voltage is injected according to some example embodiments.
Figure 9B:
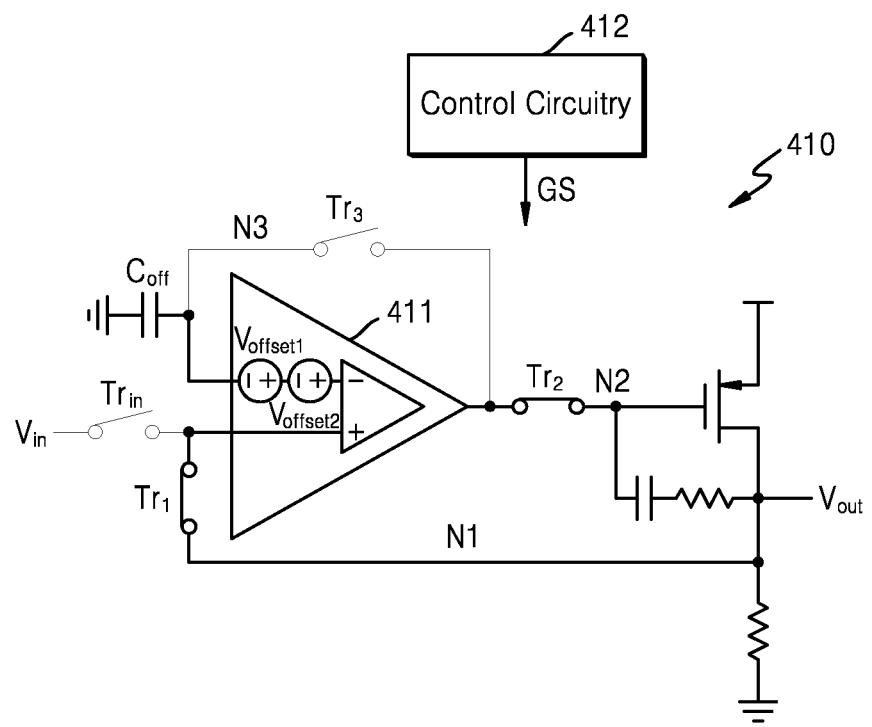
FIG. 9B is a circuit diagram corresponding to a second operation mode of an LDO regulator into which a second offset voltage is injected according to some example embodiments.

FIG. 9A is a circuit diagram corresponding to a first operation mode of an LDO regulator 410 into which a second offset voltage $V_{offset2}$ is injected according to some example embodiments and FIG. 9B is a circuit diagram corresponding to a second operation mode of an LDO regulator 410 into which a second offset voltage $V_{offset2}$ is injected according to some example embodiments.

Referring to FIG. 9A, the LDO regulator 410 may further include a voltage source corresponding to the second offset voltage $V_{offset2}$ connected to the inverting input terminal of the operational amplifier 411. Referring to FIGS. 4A and 8A together, the offset voltage $V_{offset}$ of FIG. 4A may correspond to a first offset voltage $V_{offset1}$ of FIG. 8A. At this time, the first offset voltage $V_{offset1}$ and the second offset voltage $V_{offset2}$ are not actual voltage sources, and are obtained by modeling forcibly injected extrinsic offset voltages as voltage sources by controlling an intrinsic offset voltage of the operational amplifier 411 and a differential input pair of the input voltage $V_{in}$.

The operational amplifier 411 in the first operation mode may receive the input voltage $V_{in}$ through the first terminal. The first terminal of the operational amplifier 411 may include a non-inverting input terminal (+) thereof. The input voltage $V_{in}$ may be input to the first terminal of the operational amplifier 411 in response to the turning on of an input transistor $Tr_{in}$.

A second terminal of the operational amplifier 411 may be electrically connected to a third node N3. The second terminal of the operational amplifier 411 may include an inverting input terminal (−) thereof. While the operational amplifier 411 operates in the first operation mode, the second offset voltage $V_{offset2}$ may not be applied. That is, the LDO regulator 410 may not forcibly input a mismatch of the differential input pair to the input voltage $V_{in}$ of the operational amplifier 411. At this time, the voltage level of the third node N3 may be determined based on the following equation.

$$V_{Coff}=V_{N3}=V_{in}-V_{offset1} \quad \text{[EQUATION 3]}$$

The voltage level of the third node N3 may be the same as the voltage level at which the first capacitor $C_{off}$ is buffered, and the voltage level of the third node N3 may be reduced from the voltage level of the inverting input terminal by the voltage level of the first offset voltage $V_{offset1}$.

Referring to FIG. 9B, the LDO regulator 410 may operate in the second operation mode. For example, in response to the entry into the second operation mode, the input transistor $Tr_{in}$ of the LDO regulator 410 may be turned off and the first transistor $Tr_1$ thereof may be turned on. In addition, the second offset voltage $V_{offset2}$ may be injected in response to the entry into the second operation mode. That is, the LDO regulator 410 may forcibly control the differential input pair of the input voltage $V_{in}$ for the operational amplifier 411 to generate the extrinsic offset by the second offset voltage $V_{offset2}$. On the other hand, because the first offset voltage $V_{offset1}$ is an intrinsic characteristic value of the operational amplifier 411, the first offset voltage $V_{offset1}$ may be maintained even in the entry into the second operation mode.

Accordingly, the non-inverting input node of the operational amplifier 411 may be electrically connected to the first node N1. While the LDO regulator 410 operates in the second operation mode, the second transistor $Tr_2$ of the LDO regulator 410 may be turned on and the third transistor $Tr_3$ thereof may be turned off. Because the non-inverting input node of the operational amplifier 411 is short-circuited with the inverting input node, the voltage level of the first node N1 may be the same as the voltage level of the non-inverting input node, and the voltage level of the non-inverting input node and an output voltage $V_{out}$ may be determined in accordance with the following equation.

$$V_{out}=V_{N1}=(V_{in}-V_{offset1})+(V_{offset1}+V_{offset2})=V_{in}+V_{offset2} \quad \text{[EQUATION 2]}$$

In the second operation mode, the output voltage $V_{out}$ may be the same as the voltage level of the first node N1, and the voltage level of the first node N1 may be the same as the voltage level of the non-inverting input node of the operational amplifier 411. On the other hand, the voltage level of the non-inverting input node may be obtained by increasing the voltage level at which the first capacitor $C_{off}$ is buffered by the voltage level of the sum of the first offset voltage $V_{offset1}$ and the second offset voltage $V_{offset2}$.

In other words, in the first operation mode of the operational amplifier 411 according to some example embodiments, the second offset voltage $V_{offset2}$ may not be applied by not controlling the differential input pair of the input voltage $V_{in}$ or may be applied by injecting a difference in the differential input pair of the input voltage $V_{in}$ only in the second operation mode so that the magnitude of the output voltage $V_{out}$ may be controlled. The LDO regulator 410 may control the first capacitor $C_{off}$ to be charged to a voltage level of a voltage reduced from the input voltage $V_{in}$ by the first offset voltage $V_{offset1}$ by not applying the second offset voltage $V_{offset2}$ in the first operation mode, and may control the differential input pair in order to inject the second offset voltage $V_{offset2}$ in the second operation mode to control the voltage to be increased from the voltage level at which the first capacitor $C_{off}$ is charged by the voltage level of the sum of the first offset voltage $V_{offset1}$ and the second offset voltage $V_{offset2}$ and to be output. At this time, mismatches of the first offset voltage $V_{offset1}$ with various values according to the manufacturing process of the LDO regulator 410 may always be removed in a process of repeating voltage reduction and increase in the first and second operation modes, respectively.

Figure 10:
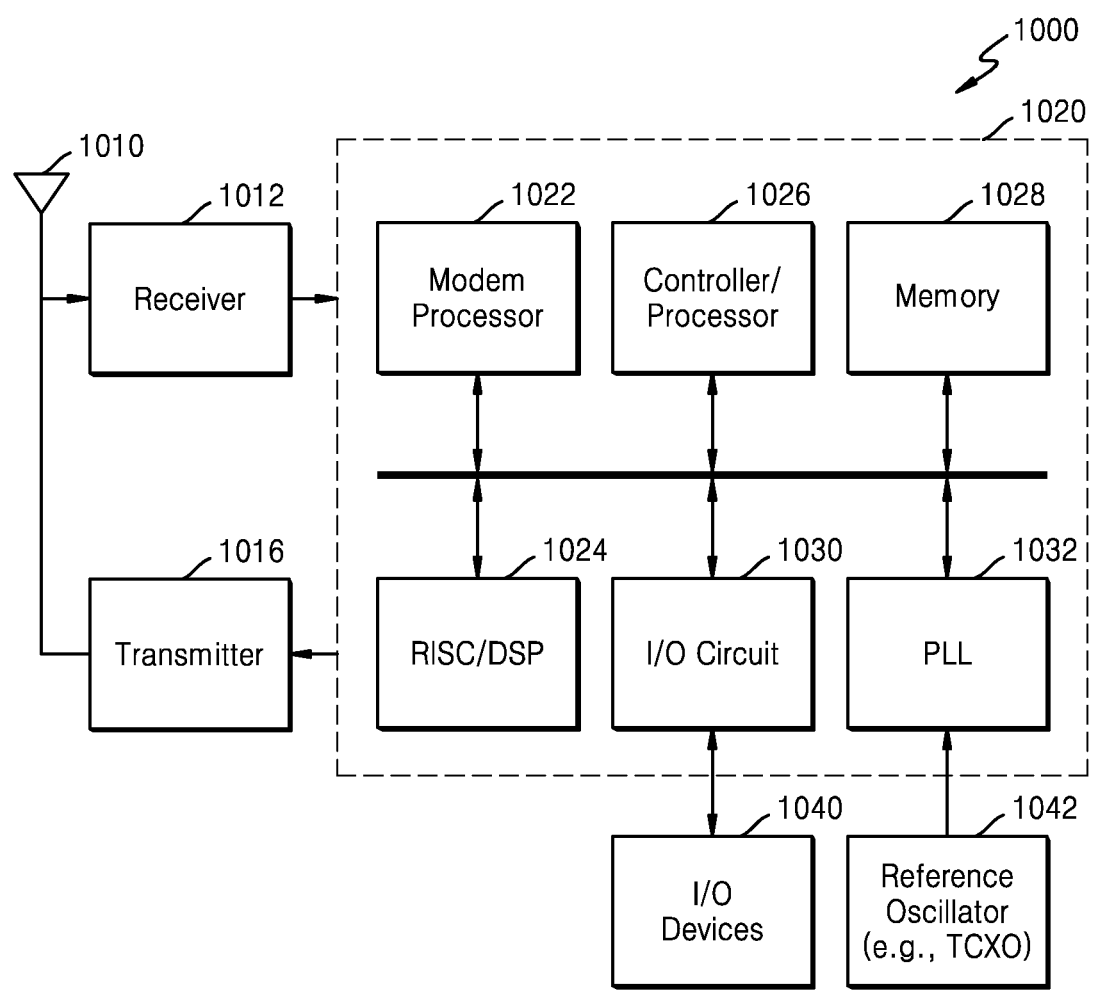
FIG. 10 is a block diagram illustrating a communication device according to some example embodiments.

FIG. 10 is a block diagram illustrating a communication device 1000 according to some example embodiments.

Referring to FIG. 10, the communication device 1000 may include a receiver 1012, a transmitter 1106, a communication module 1020, an antenna 1010, an input/output device 1040, and a reference oscillator 1042. The receiver 1012 may include the ADC circuit 10 performing an analog-to-digital conversion operation according to the example embodiments described with reference to FIGS. 1 to 9B. The receiver 1012 may convert an analog signal received from the outside through the antenna 1010 into a digital signal by using the ADC circuit 10 and may provide the digital signal to the communication module 1020. The transmitter 1016 may convert the digital signal received from the communication module 1020 into an analog signal and may output the analog signal to the outside through the antenna 1010.

The communication module 1020 may include a modem processor 1022, a reduced instruction set computer (RISC)/ digital signal processor (DSP) 1024, a controller/processor 1026, memory 1028, an input/output circuit 1030, and a phase locked loop (PLL) 1032.

The modem processor 1022 may perform processing operations, such as encoding, modulation, demodulation, and decoding for data transmission and data reception. The RISC/DSP 1024 may perform a common or specialized processing operation in the communication device 1000. The controller/processor 1026 may control blocks in the communication module 1020. The memory 1028 may store data and a variety of command code. The input/output circuit 1030 may communicate with the input/output device 1040. The input/output circuit 1030 may include the ADC circuit 10 performing the analog-to-digital conversion operation according to the example embodiments described with reference to FIGS. 1 to 13. The input/output circuit 1030 may convert a data signal received from the input/ output device 1040 into a digital signal by using the ADC circuit 10. The PLL 1032 may perform a frequency modulation operation by using a frequency signal received from the reference oscillator 1042. The reference oscillator 1042 may include a crystal oscillator (XO), a voltage controlled crystal oscillator (VCXO), or a temperature compensated crystal oscillator (TCXO). The communication module 1020 may perform a processing operation required or desired for communication by using an output signal generated by the PLL 1032.

Figure 11:
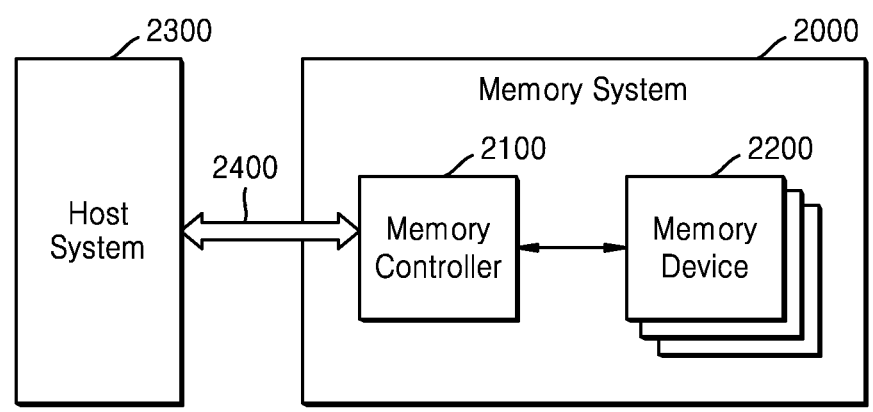
FIG. 11 is a block diagram illustrating a memory system and a host system according to some example embodiments.

FIG. 11 is a block diagram illustrating a memory system 2000 and a host system 2300 according to some example embodiments.

As illustrated in FIG. 11, the memory system 2000 and the host system 2300 may communicate with each other through an interface 2400, and the memory system 2000 may include a memory controller 2100 and memory devices 2200.

The interface 2400 may use an electrical signal and/or an optical signal, and may include a serial advanced technology attachment (SATA) interface, an SATA express (SATAe) interface, a serial attached small computer system interface (SCSI) (SAS), a universal serial bus (USB), or a combination thereof as a non-limiting example. The host system 2300 and the memory controller 2100 may include a serializer/deserializer (SerDes) for serial communication.

In some configurations, the memory system 2000 may communicate with the host system 2300 by being removably combined with the host system 2300. The memory devices 2200 may be volatile memory or non-volatile memory, and the memory system 2000 may be referred to as a storage system. For example, the memory system 2000 may include a solid-state drive or solid-state disk (SSD), an embedded SSD (eSSD), a multimedia card (MMC), or an embedded multimedia card (eMMC) as a non-limiting example. The memory controller 2100 may control the memory devices 2200 in response to a request received from the host system 2300 through the interface 2400. On the other hand, the ADC circuit 10 according to some example embodiments may be included in each of (or alternatively, at least one of) the memory controller 2100, the memory devices 2200, and the host system 2300.

Figure 12:
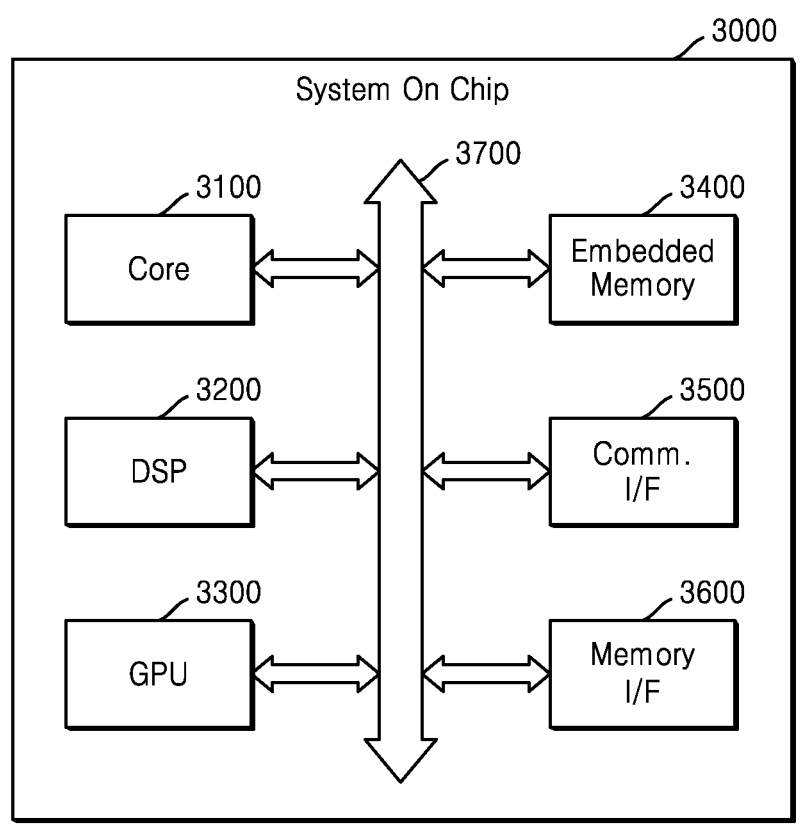
FIG. 12 is a block diagram illustrating a system-on-chip (SoC) according to some example embodiments.

FIG. 12 is a block diagram illustrating a system-on-chip (SoC) 3000 according to some example embodiments.

The SoC 3000 may refer to an integrated circuit in which parts of a computing system or another electronic system are integrated. For example, an application processor (AP) as the SoC 3000 may include parts for a processor and other functions.

Referring to FIG. 12, the SoC 3000 may include a core 3100, a digital signal processor (DSP) 3200, a graphics processing unit (GPU) 3300, embedded memory 3400, a communication interface 3500, and a memory interface 3600. Components of the SoC 3000 may communicate with one another through a bus 3700.

The core 3100 may process instructions and may control operations of the components included in the SoC 3000. For example, the core 3100 may run an operating system and execute applications on the operating system by processing a series of instructions. The DSP 3200 may generate useful data by processing, for example, a digital signal provided by the communication interface 3500. The GPU 3300 may generate data for an image output from image data provided by the embedded memory 3400 or the memory interface 3600 through a display device, or may encode image data. The embedded memory 3400 may store data required or desired to operate the core 3100, the DSP 3200, and the GPU 3300. The memory interface 3600 may provide an interface for external memory of the SoC 3000, for example, dynamic random access memory (DRAM) or flash memory.

The communication interface 3500 may provide serial communication with the outside of the SoC 3000. For example, the communication interface 3500 may access the Ethernet and may include the SerDes for the serial communication. On the other hand, the ADC circuit 10 according to some example embodiments may be applied to the communication interface 3500 and the memory interface 3600.

Any of the elements and/or functional blocks disclosed above may include or be implemented in processing circuitry such as hardware including logic circuits; a hardware/software combination such as a processor executing software; or a combination thereof. For example, the controller 300, control circuit 210, modem processor 1022, controller/processor 1026, memory controller 2100, DSP 3200 and GPU 3300 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concepts have been particularly shown and described with reference to some example embodiments thereof, it will be understood that various changes in form and details may be made therein without departing from the spirit and scope of the following claims.

What is claimed is:

1. A low dropout (LDO) regulator comprising:
    an operational amplifier connected to a capacitor receiving an input voltage through a first end and storing an offset voltage through a second end;
    a first transistor configured to control an electrical connection between the input voltage and the first end of the operational amplifier;
    a second transistor configured to control an electrical connection between the first end of the operational amplifier and a first node;
    a third transistor configured to control an electrical connection between an output end of the operational amplifier and a second node; and
    a fourth transistor configured to control an electrical connection between the second end of the operational amplifier and the output end of the operational amplifier.

2. The LDO regulator of claim 1, the LDO regulator further including control circuitry configured to control the first transistor, the second transistor, the third transistor and the fourth transistor,
    wherein, the control circuitry is configured to control the LDO regulator to operate in a first operation mode such that the first transistor is turned on, the second transistor is turned off, the third transistor is turned off, and the fourth transistor is turned on.

3. The LDO regulator of claim 1, the LDO regulator further including control circuitry configured to control the first transistor, the second transistor, the third transistor and the fourth transistor,
    wherein, the control circuitry is configured to control the LDO regulator in a first operation mode such that the offset voltage of the operational amplifier is sampled.

4. The LDO regulator of claim 2, wherein the control circuitry is configured to control the LDO regulator such that a voltage level of the capacitor at an end of the first operation mode corresponds to a value obtained by subtracting a voltage level of the offset voltage from a voltage level of the input voltage.

5. The LDO regulator of claim 4, wherein, the control circuitry is configured to control the LDO regulator such that the LDO regulator operates in a second operation mode after the first operation mode,
    wherein in the second operation mode the first transistor is turned off, the second transistor is turned on, the third transistor is turned on, and the fourth transistor is turned off.

6. The LDO regulator of claim 5, wherein
    the control circuitry is configured to control the LDO regulator such that an electrical connection between the first end of the operational amplifier and the input voltage is released and the first end of the operational amplifier is electrically connected to the first node so that a voltage level of the first end of the operational amplifier corresponds to a voltage level of an output voltage, and
    the control circuitry is configured to control the LDO regulator such that a voltage level of the first end of the operational amplifier is the same as a voltage level of the input voltage by summing up a voltage level of the capacitor corresponding to the end of the first operation mode and a voltage level of the offset voltage.

7. The LDO regulator of claim 1, the LDO regulator further including control circuitry configured to control the LDO regulator such that capacitance of the capacitor is determined based on a gate leakage current, charge injection into the first to fourth transistors, feedthrough of a clock signal, and refresh timing.

8. An analog-to-digital conversion (ADC) circuit converting an analog signal into a digital signal, the ADC circuit comprising:
    a plurality of reference voltage generators configured to generate a reference voltage;
    an analog-to-digital converter (ADC) configured to generate a comparative voltage by bit based on the reference voltage, and to generate a digital signal corresponding to the analog signal based on a result of comparing the comparative voltage by bit with the analog signal; and
    a plurality of decoupling capacitors respectively connected to the plurality of reference voltage generators and connected to the ADC via a respective one of a plurality of switches,
    wherein the reference voltage generator comprises
        an operational amplifier connected to a capacitor receiving an input voltage through a first end and storing an offset voltage through a second end,
        a first transistor configured to control an electrical connection between the input voltage and the first end of the operational amplifier,
        a second transistor configured to control an electrical connection between the first end of the operational amplifier and a first node, a third transistor configured to control an electrical connection between an output end of the operational amplifier and a second node, and a fourth transistor configured to control an electrical connection between the second end of the operational amplifier and the output end of the operational amplifier.

9. The ADC circuit of claim 8, wherein the reference voltage generator further including control circuitry configured to control the first transistor, the second transistor, the third transistor and the fourth transistor, wherein, wherein, the control circuitry is configured to control the reference voltage generator in a first operation mode such that the first transistor is turned on, the second transistor is turned off, the third transistor is turned off, and the fourth transistor is turned on, and wherein, the control circuitry is configured to control the reference voltage generator in the first operation mode such that the offset voltage of the operational amplifier is sampled.

10. The ADC circuit of claim 9, wherein the control circuitry is configured to control the reference voltage generator such that a voltage level of the capacitor at an end of the first operation mode corresponds to a value obtained by subtracting a voltage level of the offset voltage from a voltage level of the input voltage.

11. The ADC circuit of claim 10, wherein, the control circuitry is configured to control the reference voltage generator such that in a second operation mode after the first operation mode, the first transistor is turned off, the second transistor is turned on, the third transistor is turned on, and the fourth transistor is turned off.

12. The ADC circuit of claim 11, wherein the control circuitry is configured to control the reference voltage generator such that an electrical connection between the first end of the operational amplifier and the input voltage is released and the first end of the operational amplifier is electrically connected to the first node so that a voltage level of the first end of the operational amplifier corresponds to a voltage level of an output voltage, and wherein the control circuitry is configured to control the reference voltage generator such that a voltage level of the first end of the operational amplifier is the same as a voltage level of the input voltage by summing up a voltage level of the capacitor corresponding to the end of the first operation mode and a voltage level of the offset voltage.

13. A low dropout (LDO) regulator comprising:

an operational amplifier connected to a capacitor receiving an input voltage through a first end and storing a first offset voltage through a second end and configured to control a differential input pair of the input voltage and to generate a second offset voltage having a variable value;

a first transistor configured to control an electrical connection between the input voltage and the first end of the operational amplifier;

a second transistor configured to control an electrical connection between the first end of the operational amplifier and a first node;

a third transistor configured to control an electrical connection between an output end of the operational amplifier and a second node; and a fourth transistor configured to control an electrical connection between the second end of the operational amplifier and the output end of the operational amplifier.

14. The LDO regulator of claim 13, the LDO regulator further including control circuitry configured to control the first transistor, the second transistor, the third transistor and the fourth transistor, wherein, the control circuitry is configured to control the LDO regulator such that in a first operation mode, the second offset voltage is activated, the first transistor is turned on, the second transistor is turned off, the third transistor is turned off, and the fourth transistor is turned on.

15. The LDO regulator of claim 14, wherein the control circuitry is configured to control the LDO regulator such that a voltage level of the capacitor at an end of the first operation mode corresponds to a value obtained by subtracting voltage levels of the first and second offset voltages from a voltage level of the input voltage.

16. The LDO regulator of claim 15, wherein, the control circuitry is configured to control the LDO regulator such that in a second operation mode after the first operation mode, the second offset voltage is deactivated, the first transistor is turned off, the second transistor is turned on, the third transistor is turned on, and the fourth transistor is turned off.

17. The LDO regulator of claim 16, wherein the control circuitry is configured to control the LDO regulator such that a voltage level of the first end of the operational amplifier is the same as a voltage level obtained by subtracting a voltage level of the second offset voltage from a voltage level of the input voltage by summing up a voltage level of the capacitor at an end of the first operation mode and a voltage level of the first offset voltage.

18. The LDO regulator of claim 13, the LDO regulator further including control circuitry configured to control the LDO regulator such that in a first operation mode, the second offset voltage is deactivated, the first transistor is turned on, the second transistor is turned off, the third transistor is turned off, and the fourth transistor is turned on.

19. The LDO regulator of claim 18, wherein the control circuitry is configured to control the LDO regulator such that a voltage level of the capacitor at an end of the first operation mode corresponds to a value obtained by subtracting a voltage level of the first offset voltage from a voltage level of the input voltage.

20. The LDO regulator of claim 19, wherein, the control circuitry is configured to control the LDO regulator such that in a second operation mode after the first operation mode, the second offset voltage is deactivated, the first transistor is turned off, the second transistor is turned on, the third transistor is turned on, and the fourth transistor is turned off, and wherein the control circuitry is configured to control the LDO regulator such that a voltage level of the first end of the operational amplifier is the same as a voltage level obtained by adding a voltage level of the second offset voltage to a voltage level of the input voltage by summing up a voltage level of the capacitor at an end of the first operation mode and a voltage level of the first offset voltage.

* * * * *